United States Patent
Hsieh

(10) Patent No.: US 9,484,380 B1
(45) Date of Patent: Nov. 1, 2016

(54) BACKSIDE ILLUMINATION (BSI) IMAGE SENSOR AND MANUFACTURING METHOD THEREOF

(71) Applicant: UNITED MICROELECTRONICS CORP., Hsin-Chu (TW)

(72) Inventor: Cheng-Yu Hsieh, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/799,596

(22) Filed: Jul. 15, 2015

(30) Foreign Application Priority Data

Jun. 4, 2015 (CN) .......................... 2015 1 0304134

(51) Int. Cl.
*H01L 27/146* (2006.01)
*H01L 21/324* (2006.01)

(52) U.S. Cl.
CPC ......... *H01L 27/1464* (2013.01); *H01L 21/324* (2013.01); *H01L 27/14621* (2013.01); *H01L 27/14627* (2013.01); *H01L 27/14685* (2013.01)

(58) Field of Classification Search
CPC .................. H01L 27/14621; H01L 27/14627; H01L 27/1464; H01L 27/14685
See application file for complete search history.

(56) References Cited

U.S. PATENT DOCUMENTS

| 7,800,192 B2 | 9/2010 | Venezia et al. |
| 8,405,182 B2 | 3/2013 | Chou et al. |
| 8,828,779 B2 | 9/2014 | Zhao |
| 2011/0101201 A1* | 5/2011 | Venezia ............ H01L 27/14627 250/200 |
| 2011/0193147 A1* | 8/2011 | Ahn ..................... H01L 27/1461 257/292 |
| 2011/0298072 A1* | 12/2011 | Chuang ............... H01L 27/1462 257/432 |
| 2013/0134535 A1* | 5/2013 | Lenchenkov ..... H01L 27/14627 257/432 |
| 2015/0171125 A1* | 6/2015 | Jangjian ............ H01L 27/14627 257/432 |
| 2015/0279816 A1* | 10/2015 | Chen ........................ H01L 24/94 257/774 |

* cited by examiner

*Primary Examiner* — Allan R Wilson
(74) *Attorney, Agent, or Firm* — Winston Hsu; Scott Margo

(57) ABSTRACT

A back side illumination image sensor includes a substrate including a front side and a back side opposite to the front side, a plurality of sensing elements formed in the substrate, a plurality of isolation structures isolating each element, and a plurality of cambered surfaces formed on the back side of the substrate. The cambered surfaces are formed correspondingly to the sensing elements, respectively.

10 Claims, 6 Drawing Sheets

BACKSIDE ILLUMINATION (BSI) IMAGE SENSOR AND MANUFACTURING METHOD THEREOF

BACKGROUND OF THE INVENTION

1. Field of the Invention

The present invention relates to a backside illumination (hereinafter abbreviated as BSI) image sensor and a manufacturing thereof, and more particularly, to a BSI image sensor with a backside dual lens and a manufacturing method thereof.

2. Description of the Prior Art

With the development of computer and communications industries, demand for high-efficiency image sensor has been increased. Such image sensors are used in various fields, such as digital cameras, camcorders, personal communications systems, game components, monitors, medical micro camera, robots, etc.

BSI image sensors are popular high-efficiency image sensors in the present industry. Because BSI image sensor fabrication can be easily integrated into conventional semiconductor processes, it has advantages of low cost, tiny size, and high integration. Moreover, BSI image sensor itself further has advantages of low operation voltage, lower power consumption, high quantum efficiency, low read-out noise, and random access. Therefore, BSI image sensor is prevalently adopted in the aforementioned electronic products.

With the progress in the semiconductor manufacturing technology, BSI image sensor confronts further demands not only for ever-decreasing size, but also for improvement on photo-electric conversion efficiency and sensitivity, and low noise.

SUMMARY OF THE INVENTION

According to an aspect of the present invention, a method for manufacturing a BSI image sensor is provided. The method includes following steps: A substrate is provided. The substrate includes a front side and a back side opposite to the front side. The substrate further includes a plurality of isolation structures and a plurality of sensing elements formed therein. Next, the isolation structures are exposed from the back side of the substrate. Subsequently, a thermal treatment is performed to the back side of the substrate to form a plurality of cambered surfaces on the back side of the substrate. The cambered surfaces are formed correspondingly to the sensing elements, respectively.

According to an aspect of the present invention, a BSI image sensor is provided. The BSI image sensor includes a substrate, a plurality of sensing elements formed in the substrate, a plurality of isolation structures isolating the sensing elements in the substrate, and a plurality of cambered surfaces. The substrate includes a front side and a back side opposite to the front side, and the cambered surfaces are formed on the back side of the substrate. Furthermore, the cambered surfaces are formed correspondingly to the sensing elements, respectively.

According to the BSI image sensor and the manufacturing method thereof provided by the present invention, the isolation structures are exposed after all the elements positioned on the front side of the substrate are formed. And the thermal treatment is subsequently performed to the back side. Consequently, the cambered surfaces are formed on the back side of the substrate. More important, the cambered surfaces are formed correspondingly to the sensing elements, respectively. The cambered surfaces serve as light-convergence units and thus the incident light are condensed and aimed to the sensing elements. Accordingly, photo-electric conversion efficiency and sensitivity of the BSI image sensor are both improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for manufacturing a BSI image sensor provided by a first preferred embodiment of the present invention, wherein FIGS. 3-6 are cross-sectional views taken along a line A-A' of FIG. 2, and FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 8-10 are schematic drawings illustrating a method for manufacturing a BSI image sensor provided by a second preferred embodiment of the present invention, wherein FIG. 9 is a schematic drawing in a step subsequent to FIG. 8, and FIG. 10 is a schematic drawing in a step subsequent to FIG. 9.

DETAILED DESCRIPTION

Figure 1:
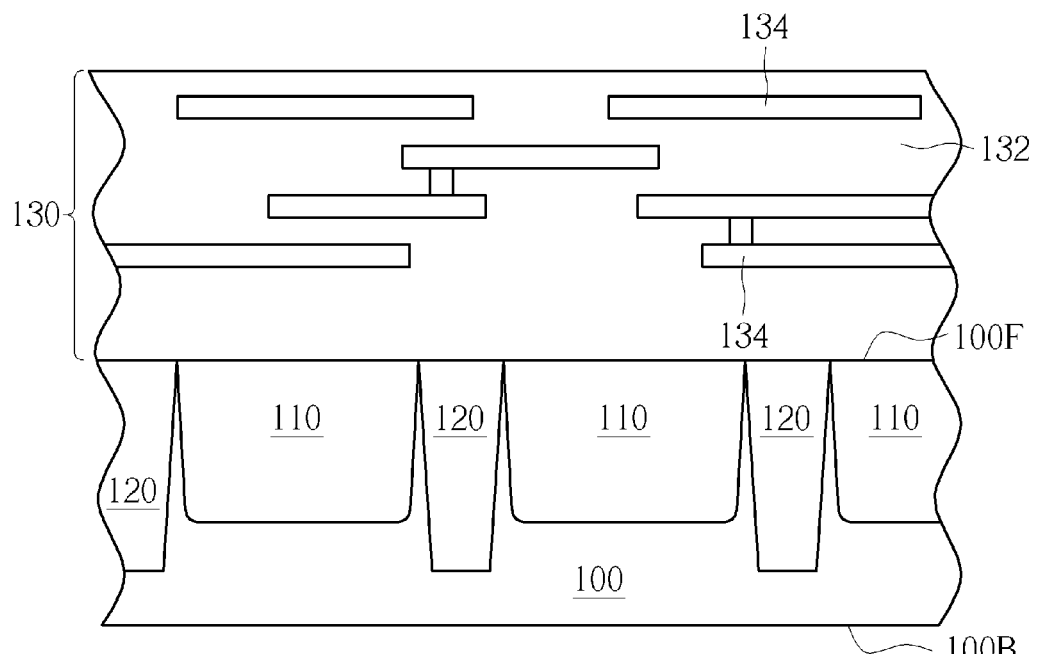

Please refer to FIGS. 1-6, which are schematic drawings illustrating a method for manufacturing a BSI image sensor provided by a first preferred embodiment of the present invention. As shown in FIG. 1, a substrate 100 is provided. The substrate 100 includes, for example but not limited to, a silicon substrate, a silicon-containing substrate, an III-V group-on-silicon substrate such as a GaN-on-silicon substrate, a graphene-on-silicon substrate, or a silicon-on-insulator (SOI) substrate. The substrate 100 includes a front side of 100F and a back side 100B opposite to the front side 100F. A plurality of sensing elements are formed in the substrate 100. The sensing element includes charge-coupled device (CCD), complementary metal-oxide-semiconductor (CMOS) image sensor (CMOS image sensor, CIS), active-pixel sensor (API), or passive-pixel sensor (PPI). Furthermore, each of the sensing elements includes at least a sensing region 110 such as a photodiode. The substrate 100 further includes a plurality of isolation structures 120 formed therein. The isolation structures 120 are formed to provide electrical isolation between the sensing elements and to prevent noise. The isolation structures 120 include materials with a refractive index different from the substrate 100. Therefore, the isolation structures not only render electrical isolation between the sensing elements but also cause light reflection toward the sensing regions 110, and thus photo-electric conversion efficiency is improved. In the preferred embodiment, the isolation structures 120 are formed by a deep trench isolation (DTI) fabrication process. Briefly speaking, a plurality of deep trenches (not shown) are formed in the substrate 100 by performing an etching process on the front side 100F or the back side 100B of the substrate 100 (in the preferred embodiment, the etching process is performed on the front side 100F of the substrate 100). Next, the deep trenches are filled with insulating materials such as silicon oxide and followed by performing a planarization process to remove superfluous silicon oxide. Consequently, the isolation structures 120 as shown in FIG. 1 are obtained.

Please still refer to FIG. 1. An interconnection structure 130 is formed on the front side 100F of the substrate 100. The interconnection structure 130 includes a plurality of dielectric layers 132 such as interlayer dielectric layers or inter-metal dielectric (IMD) layers and a plurality of metal layers 134. The dielectric layers 132 include, for example but not limited to, silicon oxide and the metal layers 134 include, also for example but not limited to, aluminum (Al) or copper (Cu). It is well-known to those skilled in the art that the interconnection structure 130 is formed by steps of forming one dielectric layer 132, forming recesses (not shown) in the dielectric layer 132, and filling up the recesses with metal material such as Al or Cu to form the metal layers 134. These abovementioned steps can be repeated any number of times to form the stacked structure of the interconnection structure 130.

Figure 2:
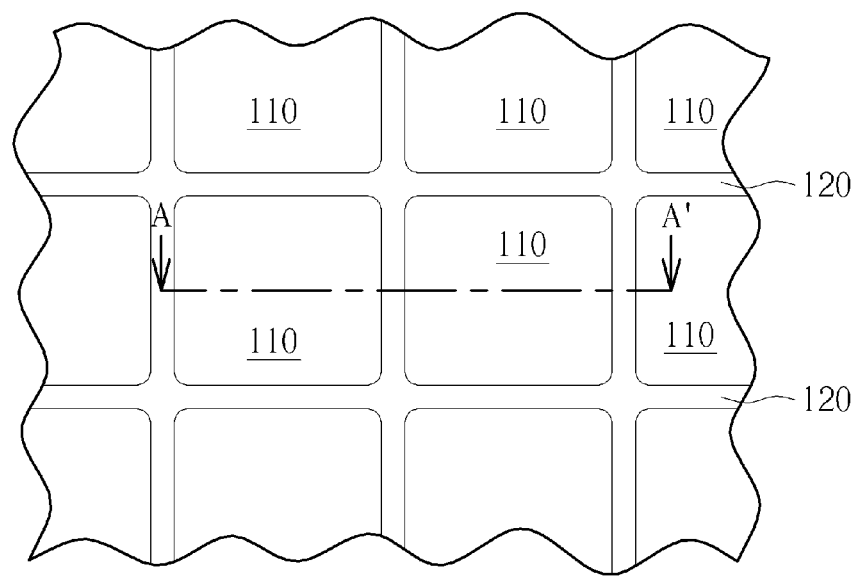
Figure 3:
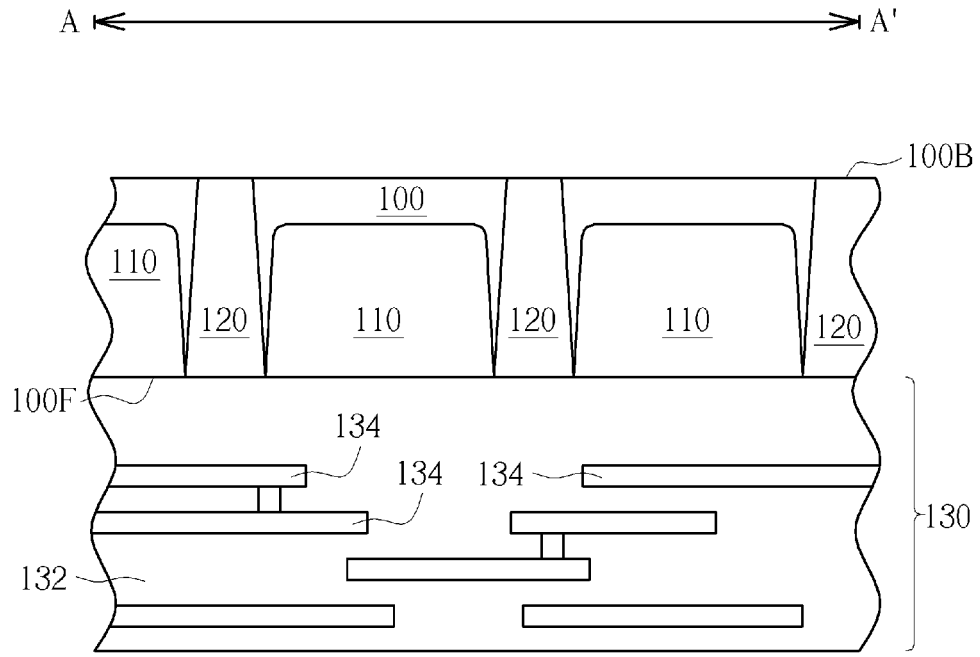

Please refer to FIGS. 2 and 3. It is noteworthy that FIGS. 3-6 are cross-sectional views taken along a line A-A' of FIG. 2. The substrate 100 is then disposed reversely, and thinned down from the back side 100B of the substrate 100 until the isolation structures 120 are exposed from the back side 100B. The substrate thinning-down process can be, for example but not limited to, a chemical mechanical polishing (hereinafter abbreviated as CMP) process.

Figure 4:
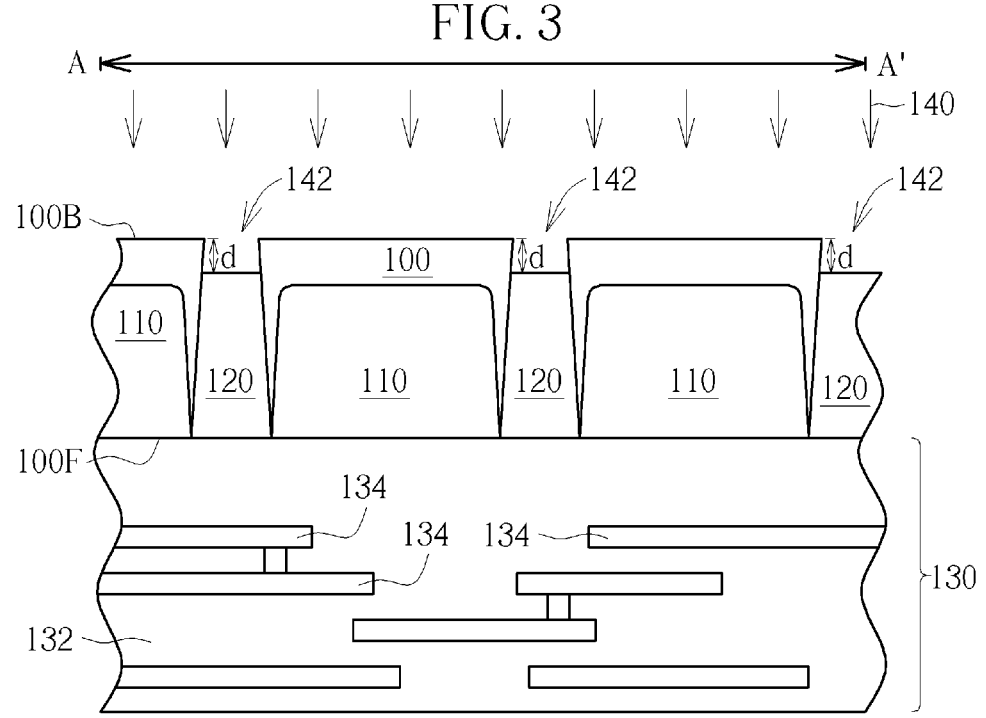

Please refer to FIG. 4. After exposing the isolation structures 120 from the back side 100B of the substrate 100, an etching process 140 is performed on the back side 100B of the substrate 100. The etching process 140 is performed to remove a portion of each isolation structure 120 and thus a recess 142 is formed in each isolation structure 120. The recesses 142 include a depth "d", and the depth "d" is between 0.01 micrometers (µm) and 0.1 µm, but not limited to this. It is noteworthy that because the isolation structures 120 include materials different from the substrate 100, the etching process 140 is performed to form the recesses 142 without damaging the back side 100B of the substrate 100. And since the substrate 100 is impervious to the etching process 140, no extra protecting layer or mask layer is required in the preferred embodiment.

Figure 5:
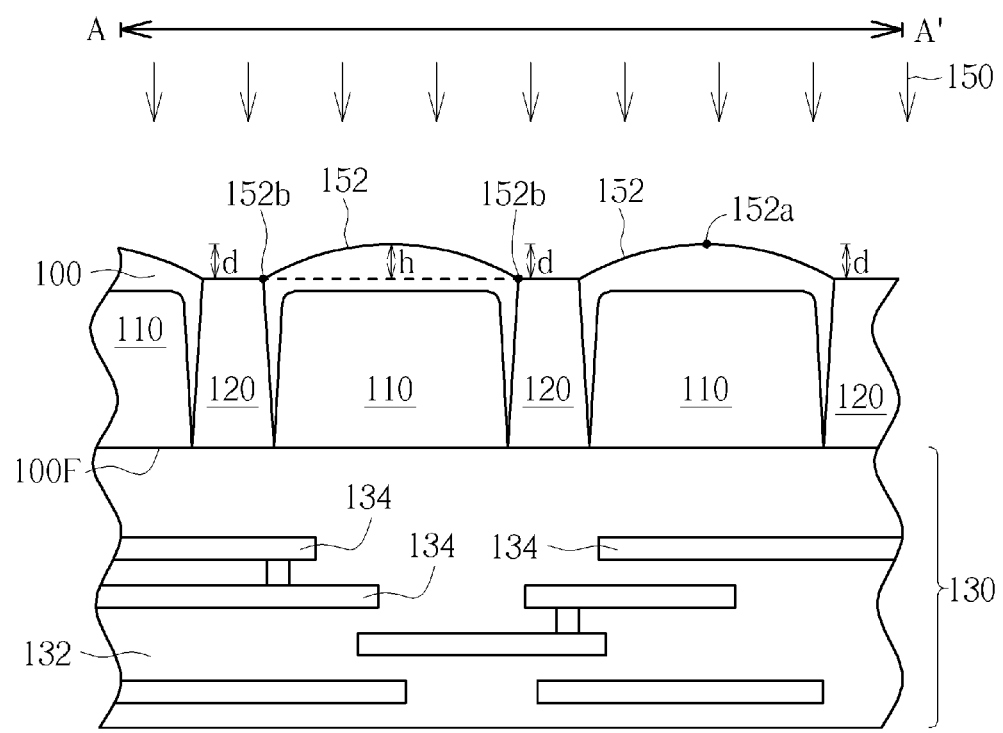

Please refer to FIG. 5. Next, a surface treatment such as a thermal treatment 150 is performed to the back side 100B of the substrate 100. The thermal treatment 150 can include a LASER thermal processing, but not limited to this. In the preferred embodiment, a processing temperature of the thermal treatment 150 is larger than 1000° C. For example but not limited to, the processing temperature of the thermal treatment 150 is 1400° C. A processing time of the thermal treatment 150 is between several decades milliseconds to several hundreds milliseconds, but not limited to this. It is noteworthy that the thermal treatment 150 is performed to melt the silicon surface on the back side 100B of the substrate 100. And the melted silicon includes a high degree of cohesion and thus the silicon surface on the back side 100B of the substrate 100 is curved and cambered by the thermal treatment 150. However, it should be easily realized that the cambering degree can be controlled by adjusting processing parameter such as processing time, processing temperature, pressure, and/or by choosing different gas introduced in the thermal treatment 150. Accordingly, a plurality of cambered surfaces 152 are formed on the back side 100B of the substrate 100 by the thermal treatment 150. More important, the cambered surfaces 152, as shown in FIG. 5, are formed correspondingly to the sensing elements/ the sensing regions 110, respectively. Furthermore, the sensing elements are formed in between the interconnection structure 130 and the cambered surfaces 152. As shown in FIG. 5, in this A-A' line cross-sectional view, the cambered surfaces 152 respectively include one camber apex 152a and two bottom ends 152b, and the two bottom ends 152b directly contact the isolation structures 120. Therefore, the isolation structures 120 not only electrically isolate the sensing elements but also physically isolate the cambered surfaces 152. Furthermore, a vertical distance between the camber apex 152a and the bottom ends 152b is larger than or equal to the depth "d" (depicted by the dotted line in FIG. 5) of the recesses 142 (shown in FIG. 4). Additionally, the surface treatment can be any suitable treatment other than the thermal treatment 150.

It is noteworthy that in a modification to the preferred embodiment, the etching process 140 can be omitted. That is, the thermal treatment 150 is performed directly after exposing the isolation structures 120 from the back side 100B of the substrate 100. Because of the different melting points between the substrate 100 (including silicon) and the isolation structures 120 (including insulating material), the cambered surfaces 152 can be formed without impacting surface profile of the isolation structures 120 by the thermal treatment 150.

Figure 6:
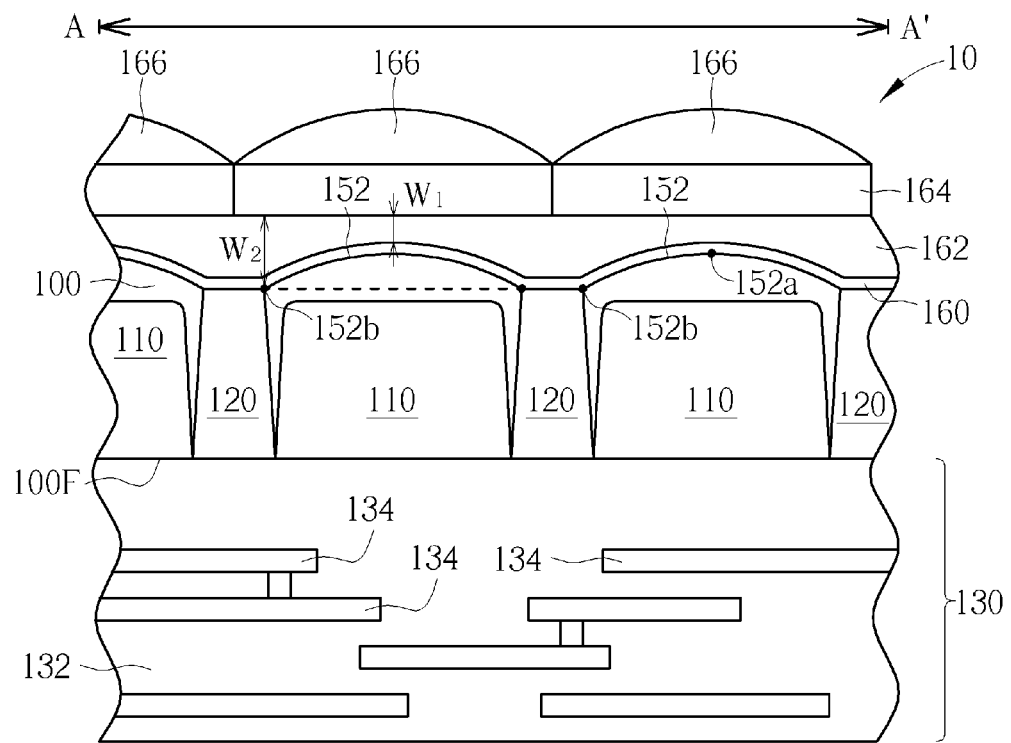

Please refer to FIG. 6. After forming the cambered surfaces 152, an anti-reflective coating (hereinafter abbreviated as ARC) 160 is directly formed on the cambered surfaces 152. As shown in FIG. 6, the ARC 160 is conformally formed on the cambered surfaces 152. Furthermore, the ARC 160 directly contacts the cambered surfaces 152, therefore light reflection is efficaciously prevented. Additionally, the ARC 160 directly contacts the isolation structures 120, too. After forming the ARC 160, a passivation layer 162, a color filter array (hereinafter abbreviated as CFA) 164 and a plurality of micro-lens 166 are sequentially formed on the back side 100B of the substrate 100. It is noteworthy that since the cambered surfaces 152 are formed on the back side 100B of substrate 100 and the ARC 160 is conformally formed on the cambered surfaces 152, the passivation layer 162 is required to provide a flat surface on the back side 100B of substrate 100, and thus the CFA 164 and the micro-lens 166 formed on this flat surface are able to provide its optical functions. As shown in FIG. 6, the CFA 164 includes a plurality of color filters and the color filters are formed correspondingly to the sensing elements, respectively. In the same concept, the micro-lens 166 are formed correspondingly to the sensing elements, respectively. After forming the micro-lens 166, a BSI image sensor 10 is obtained. Additionally, another passivation layer (not shown) can be selectively formed on the micro-lens 166 and followed by performing any other process such as outer electrical connection fabricating process. Since the processes are well-known to those skilled in the art, those details are omitted in the interest of brevity. It is noteworthy that a distance $W_1$ between the camber apexes 152a of the cambered surfaces 152 and a bottom of the CFA 164 is smaller than a distance $W_2$ between the bottom ends 152b of the cambered surfaces 152 and the bottom of the CFA 164, as shown in FIG. 6. Furthermore, a cambering direction of the cambered surfaces 152 is the same with a cambering direction of the micro-lens 166.

Figure 7:
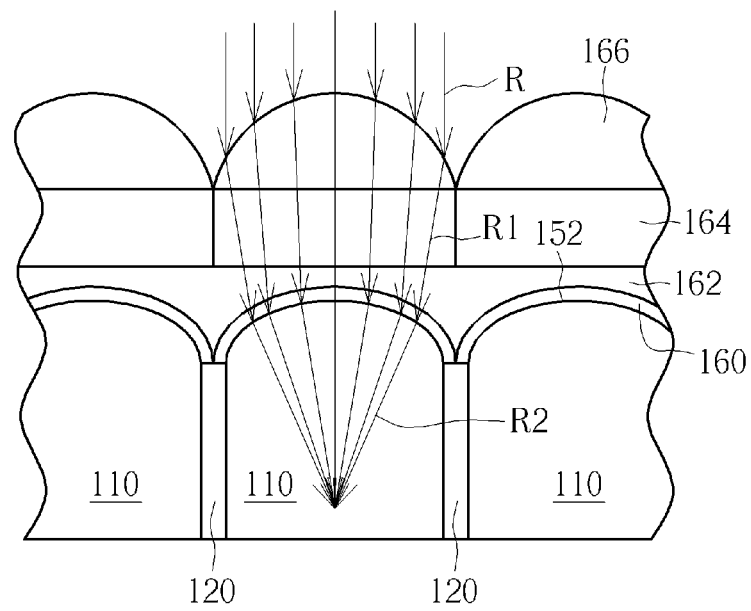
FIG. 7 is a schematic drawing illustrating an optical path of the BSI image sensor provided by the present invention.

Please refer to FIG. 7, which is a schematic drawing illustrating an optical path of the BSI image sensor provided by the present invention. It should be noted that to emphasize the influence to incident lights caused by the micro-lens 166 and the cambered surfaces 152, elements formed in the front side 100F of the substrate 100 are all omitted. As shown in FIG. 7, the incident light R first enters the micro-lens 166 and thus a first refracted light R1 is generated. The first refracted light R1 then passes the CFA 164, the passivation layer 162 and the ARC 160, and reaches the cambered surfaces 152. When entering the cambered surfaces 152, a second refracted light R2 is generated. It is noteworthy that because a refractive index of silicon is near 4 and the cambered surfaces 152 render light-condensing ability, the second refracted light R2 is more condensed than the first refracted light R1. It is concluded that the micro-lens 166 and the cambered surfaces 152 form dual lens and lights passing the dual lens are further condensed and aimed to the sensing regions 110.

According to the BSI image sensor 10 and the manufacturing method thereof provided by the first preferred embodiment, the isolation structures 120 are exposed after all the elements positioned on the front side 100F of the substrate 100, such as the sensing elements and the interconnection structure 130, are formed. And the thermal treatment 150 is then performed to the back side 100B. Consequently, the cambered surfaces 152 are formed on the back side 100B of the substrate 100. The micro-lens 166 and the cambered surfaces 152 form dual lens which serve as light-convergence units, and thus the incident light passing the dual lens are further condensed and aimed to the sensing elements. Consequently, photo-electric conversion efficiency and sensitivity of the BSI image sensor 10 are both improved.

Figure 8:
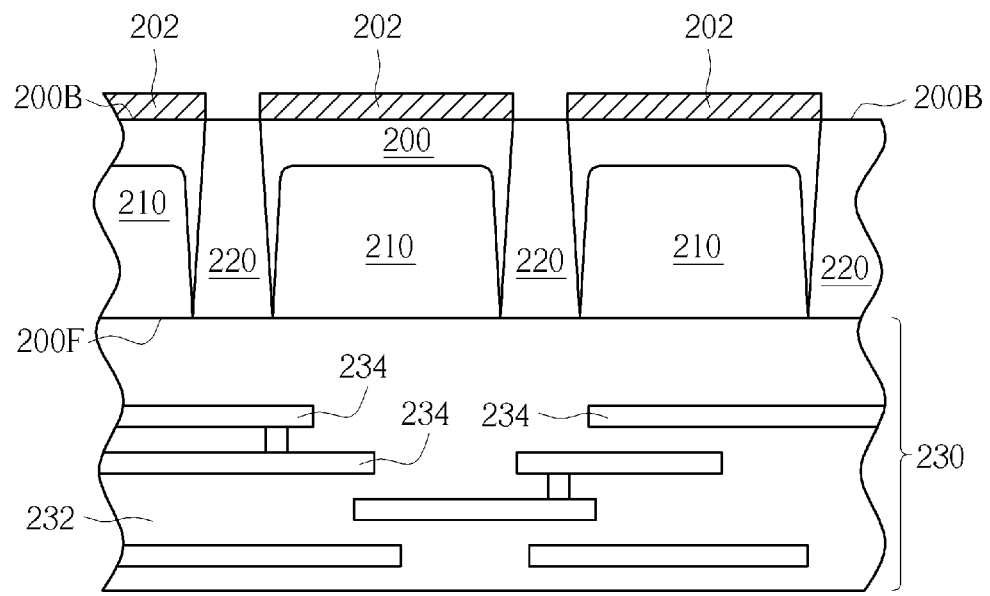
Figure 9:
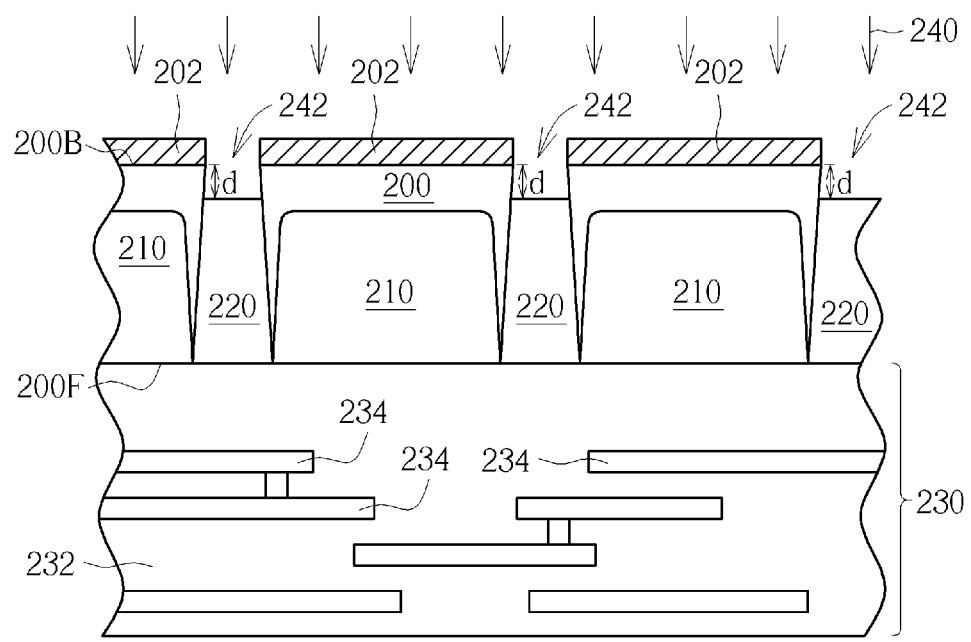
Figure 10:
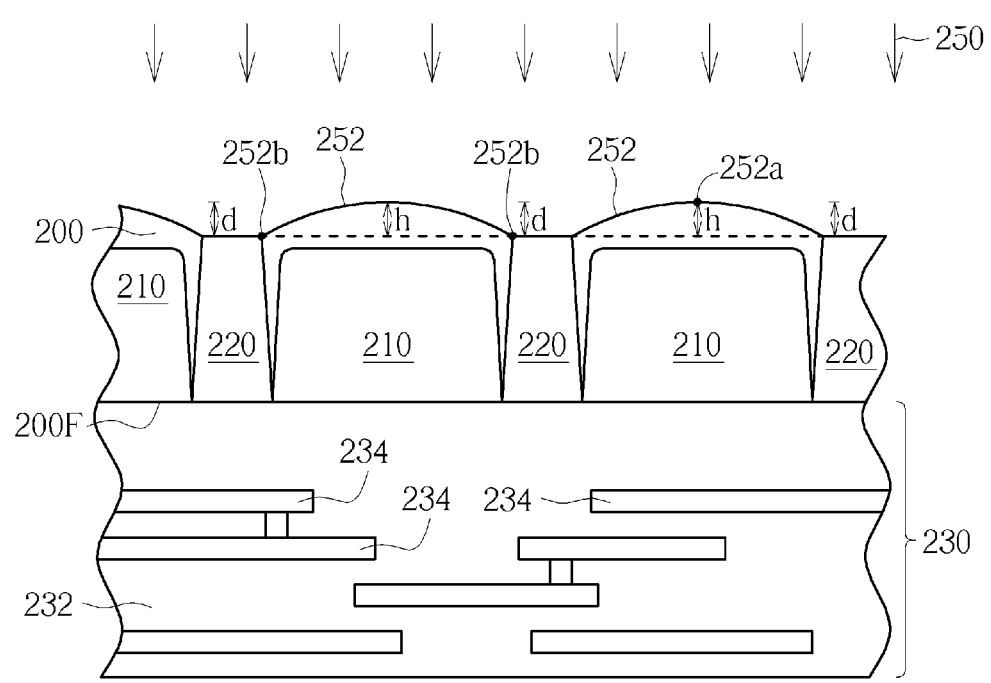

Please refer to FIGS. 8-10, which are schematic drawings illustrating a method for manufacturing a BSI image sensor provided by a second preferred embodiment of the present invention. As shown in FIG. 8, a substrate 200 is provided. The substrate 200 includes materials the same with those described in the first preferred embodiment, therefore the material choice of the substrate 200 is omitted for simplicity. The substrate 200 includes a front side of 200F and a back side 200B opposite to the front side 200F. A plurality of sensing elements are formed in the substrate 200. The sensing elements include various types as mentioned in the first preferred embodiment, and thus those details are omitted for simplicity, too. Furthermore, the sensing elements respectively include at least a sensing region 210 such as a photodiode. The substrate 200 further includes a plurality of isolation structures 220 formed therein. The isolation structures 220 are formed to provide electrical isolation between the sensing elements and to prevent noise. As mentioned above, the isolation structures 220 not only renders electrical isolation between the sensing elements but also causes light reflection toward the sensing regions 210, and thus photo-electric conversion efficiency is improved. In the preferred embodiment, the isolation structures 220 are formed by implanting suitable dopants into the substrate 200. Consequently, the isolation structures 220 include doped silicon according to the preferred embodiment.

Please still refer to FIG. 8. An interconnection structure 230 is formed on the front side 200F of the substrate 200. As mentioned above, the interconnection structure 230 includes a plurality of dielectric layers 232 and a plurality of metal layers 234. The material choice and fabricating steps for forming the interconnection structure 230 are the same as described in the first preferred embodiment, therefore those details are omitted in the interest of brevity. The substrate 200 is then disposed reversely, and thinned down from the back side 200B of the substrate 200 until the isolation structures 220 are exposed from the back side 200B. The substrate thinning-down process can be, for example but not limited to, a CMP process. After exposing the isolation structures 220 from the back side 200B of the substrate 200, a patterned hard mask 202 is formed on the back side 200B of the substrate 200. The patterned hard mask 202 exposes the isolation structures 220 as shown in FIG. 8.

Please refer to FIG. 9. After forming the patterned hard mask 202, an etching process 240 is performed to the back side 200B of the substrate 200. The etching process 240 is performed to remove a portion of each isolation structure 220 and thus a recess 242 is formed in each isolation structure 220. The recesses 242 include a depth "d", and the depth "d" is between 0.01 μm and 0.1 μm, but not limited to this. It is noteworthy that because the isolation structures 220 include materials the same with the substrate 200 (the isolation structures 220 include doped silicon and the substrate 200 includes silicon), the patterned hard mask 202 is required to protect the substrate 200 during the etching process 240.

Please refer to FIG. 10. After forming the recesses 242, the patterned hard mask 202 is removed. Next, a surface treatment such as a thermal treatment 250 is performed to the back side 200B of the substrate 200. The thermal treatment 250 can include a LASER thermal processing. In the preferred embodiment, a processing temperature of the thermal treatment 250 is larger than 1000° C. For example but not limited to, the processing temperature of the thermal treatment 250 is 1400° C. A processing time of the thermal treatment 250 is between several decades milliseconds to several hundreds milliseconds, but not limited to this. As mentioned above, the thermal treatment 250 is performed to melt the silicon surface on the back side 200B of the substrate 200. And the melted silicon includes a high degree of cohesion and thus the silicon surface on the back side 200B of the substrate 200 is curved and cambered by the thermal treatment 250. However, it should be easily realized that the cambering degree can be controlled by adjusting processing parameter such as processing time, processing temperature, pressure, and by choosing different gas introduced in the thermal treatment 250. Accordingly, a plurality of cambered surfaces 252 are formed on the back side 200B of the substrate 200 by the thermal treatment 250. The cambered surfaces 252, as shown in FIG. 10, are formed correspondingly to the sensing elements/the sensing regions 210, respectively. Furthermore, the sensing elements are formed in between the interconnection structure 230 and the cambered surfaces 252. As shown in FIG. 10, in this A-A' line cross-sectional view, the cambered surfaces 252 respectively include one camber apex 252a and two bottom ends 252b, and the two bottom ends 252b directly contact the isolation structures 220. Therefore, the isolation structures 220 not only electrically isolate the sensing elements but also physically isolate the cambered surfaces 252. Furthermore, a vertical distance between the camber apex 252a and the bottom ends 252b is larger than or equal to the depth d (depicted by the dotted line in FIG. 10) of the recesses 242 (shown in FIG. 9). Additionally, the surface treatment can be any suitable treatment other than the thermal treatment 250.

After forming the cambered surfaces 252, an ARC, a passivation layer, a CFA and a plurality of micro-lens are sequentially formed on the cambered surfaces 252. Since the steps for forming the ARC, the passivation layer, the CFA and the micro-lens are the same with those described in the first preferred embodiment, those details are omitted for simplicity. More important, a BSI image sensor 10 including the same optical path as shown in FIG. 7 is obtained after forming the micro-lens.

According to the BSI image sensor 10 and the manufacturing method thereof provided by the second preferred embodiment, the isolation structures 220 are exposed after all the elements positioned on the front side 200F of the substrate 200, such as the isolation structure 220, the sensing elements and the interconnection structure 230, are formed. And the patterned hard mask 202 is then formed on the back side 200B of the substrate 200 to protect the silicon surface on the back side 200B. Next, the portion of each isolation structure 220 is removed to form the recesses 242 and following by performing the thermal treatment 250 to the back side 200B. Consequently, the cambered surfaces 252 are formed on the back side 200B of the substrate 200. And the recesses 242 serve as boundaries of the cambered surfaces 252. Accordingly, the isolation structures 220 not only electrically isolate the sensing elements but also physically isolate the cambered surfaces 252. As shown in FIG. 7, the micro-lens and the cambered surfaces 252 form dual lens and lights passing the dual lens are further condensed and aimed to the sensing regions 210. Consequently, photo-electric conversion efficiency and sensitivity of the BSI image sensor are both improved.

According to the BSI image sensor and the manufacturing method thereof provided by the present invention, the isolation structures are exposed after all the elements positioned on the front side of the substrate are formed. And the thermal treatment is then performed to the back side. Consequently, the cambered surfaces are formed on the back side of the substrate. More important, the cambered surfaces are formed correspondingly to the sensing elements, respectively. Because the refractive index of silicon is large than the ambient elements and the cambered surface includes light-convergence ability, the cambered surfaces and the micro-lens form dual lens which serve as more efficacious light-convergence units. Thus the incident light are further condensed and aimed to the sensing elements by the dual-lens. Consequently, photo-electric conversion efficiency and sensitivity of the BSI image sensor are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A BSI image sensor comprising:
    a substrate comprising a front side and a back side opposite to the front side;
    a plurality of sensing elements formed in the substrate;
    a plurality of isolation structures formed in the substrate, the isolation structures contacting and isolating the sensing elements from each other in the substrate; and
    a plurality of cambered surfaces formed on the back side of the substrate, the cambered surfaces being formed correspondingly to the sensing elements, respectively, wherein the cambered surfaces and the substrate comprise a same material.

2. The BSI image sensor according to claim 1, further comprising an interconnection structure formed on the front side of the substrate.

3. The BSI image sensor according to claim 2, wherein the sensing elements are formed between the interconnection structure and the cambered surfaces.

4. The BSI image sensor according to claim 1, wherein the isolation structures comprise insulating materials or doped silicon.

5. The BSI image sensor according to claim 1, further comprising at least an anti-reflective coating (ARC), a color filter array (CFA) and a plurality of micro-lens formed on the back side of the substrate.

6. The BSI image sensor according to claim 5, wherein the ARC directly contacts the cambered surfaces.

7. The BSI image sensor according to claim 5, further comprising a passivation layer sandwiched between the ARC and the CFA.

8. The BSI image sensor according to claim 5, wherein the cambered surfaces respectively comprises a camber apex and two bottom ends, and the bottom ends contact the isolation structures.

9. The BSI image sensor according to claim 8, wherein a distance between the camber apex and a bottom of the CFA is smaller than a distance between the bottom ends and the bottom of the CFA.

10. The BSI image sensor according to claim 5, wherein a cambering direction of the cambered surfaces is the same with a cambering direction of the micro-lens.

* * * * *